US012713559B2

(12) United States Patent
Ham et al.

(10) Patent No.: US 12,713,559 B2
(45) Date of Patent: Aug. 18, 2026

(54) ELECTRONIC DEVICE COMPRISING HEAT DISSIPATION STRUCTURE

(71) Applicant: Samsung Electronics Co., Ltd., Suwon-si (KR)

(72) Inventors: Taewook Ham, Suwon-si (KR); Moonhyung Kwon, Suwon-si (KR); Younggirl Yun, Suwon-si (KR); Taekkyun Choi, Suwon-si (KR); Wonhyung Heo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 148 days.

(21) Appl. No.: 18/594,595

(22) Filed: Mar. 4, 2024

(65) Prior Publication Data

US 2024/0206120 A1 Jun. 20, 2024

Related U.S. Application Data

(63) Continuation of application No. PCT/KR2022/014144, filed on Sep. 22, 2022.

(30) Foreign Application Priority Data

Sep. 28, 2021 (KR) ........................ 10-2021-0128315

(51) Int. Cl.
*H05K 7/00* (2006.01)
*H05K 7/20* (2006.01)

(52) U.S. Cl.
CPC ................................ *H05K 7/20336* (2013.01)

(58) Field of Classification Search
CPC .................................................. H05K 7/20336

(Continued)

(56) References Cited

U.S. PATENT DOCUMENTS 10,354,356 B2 7/2019 Hu et al.
2002/0090546 A1 7/2002 Mu-Tsai et al.

(Continued)

FOREIGN PATENT DOCUMENTS

CN 206237466 U 6/2017
CN 108515515 A 9/2018

(Continued)

OTHER PUBLICATIONS

Korean Office Action with English translation dated Jun. 16, 2025; Korean Appln. No. 10-2021-0128315.

(Continued)

*Primary Examiner* — Zhengfu J Feng
(74) *Attorney, Agent, or Firm* — Jefferson IP Law, LLP

(57) ABSTRACT

The present disclosure relates to an electronic device comprising a heat dissipation structure. The electronic device may comprise: a bracket comprising a first area, a second area partitioned from the first area, and a heat dissipation area extendedly formed from a portion of the first area up to a portion of the second area; a circuit board comprising a heating source and disposed in the first area; a battery disposed in the second area; a vapor chamber disposed in the heat dissipation area and, in order to provide a transfer path for heat generated from the heating source, comprises a first part disposed so as to face the heating source, and a second part disposed so as to face the battery; and a filling member coated between the second area and the battery in order to transfer the heat dissipated from the vapor chamber to the battery, wherein the vapor chamber has a buffer area formed at an edge area thereof in order to receive the filling member.

15 Claims, 11 Drawing Sheets

(58) Field of Classification Search
USPC .......................................................... 361/700
See application file for complete search history.

(56) References Cited

U.S. PATENT DOCUMENTS

| | | | | |
|---|---|---|---|---|
| 2007/0115644 | A1 | 5/2007 | Kim et al. | |
| 2014/0247556 | A1* | 9/2014 | Eid | H01L 23/3675 29/592.1 |
| 2015/0055300 | A1* | 2/2015 | Hsieh | G06F 1/20 165/104.26 |
| 2015/0181764 | A1* | 6/2015 | Honmura | H01L 23/427 165/104.21 |
| 2015/0220122 | A1 | 8/2015 | Rhee et al. | |
| 2015/0241935 | A1 | 8/2015 | Jang et al. | |
| 2016/0135331 | A1* | 5/2016 | Wu | G06F 1/1643 361/700 |
| 2016/0182113 | A1* | 6/2016 | Wu | H04B 1/3888 455/575.8 |
| 2016/0341486 | A1* | 11/2016 | Kim | H01L 23/427 |
| 2018/0007181 | A1 | 1/2018 | Lee et al. | |
| 2018/0035528 | A1 | 2/2018 | Kim et al. | |
| 2018/0146539 | A1 | 5/2018 | Zhang et al. | |
| 2018/0284856 | A1* | 10/2018 | Shah | G06F 1/1616 |
| 2019/0043779 | A1 | 2/2019 | Chung et al. | |
| 2019/0130519 | A1 | 5/2019 | Hu et al. | |
| 2020/0383241 | A1 | 12/2020 | Lee et al. | |
| 2021/0055059 | A1 | 2/2021 | Lee et al. | |
| 2021/0372709 | A1 | 12/2021 | Bandyopadhyay et al. | |
| 2021/0410268 | A1* | 12/2021 | Moon | G06F 1/1698 |
| 2022/0069437 | A1* | 3/2022 | Yoo | H01Q 1/42 |
| 2022/0408603 | A1* | 12/2022 | Chen | H05K 1/021 |

FOREIGN PATENT DOCUMENTS

| | | | |
|---|---|---|---|
| CN | 108770291 | A | 11/2018 |
| EP | 3 855 875 | A1 | 7/2021 |
| JP | 2012-004358 | A | 1/2012 |
| JP | 5574170 | B2 | 8/2014 |
| JP | 2015-015545 | A | 1/2015 |
| JP | 2015-200465 | A | 11/2015 |
| KR | 10-0677620 | B1 | 2/2007 |
| KR | 10-2013-0025671 | A | 3/2013 |
| KR | 10-2014-0000933 | A | 1/2014 |
| KR | 10-2014-0031358 | A | 3/2014 |
| KR | 10-2018-0014603 | A | 2/2018 |
| KR | 10-2020-0054826 | A | 5/2020 |
| KR | 10-2021-0100450 | A | 8/2021 |
| RU | 2 701 165 | C2 | 9/2019 |
| WO | 2021/157835 | A1 | 8/2021 |

OTHER PUBLICATIONS

Extended European Search Report dated Mar. 15, 2024; European Appln. No. 22773097.5-1201 / 4181643 PCT/KR2022014144.

International Search Report with Written Opinion and English translation dated Jan. 2, 2023; International Application No. PCT/KR2022/014144.

Indian Office Action dated Oct. 15, 2025; Indian Appln. No. 202447029182.

Russian Office Action dated Dec. 15, 2025, issued in Russian Application No. 2024111509.

Indian Hearing Notice dated May 11, 2026, issued in Indian Patent Application No. 202447029182.

* cited by examiner

ELECTRONIC DEVICE COMPRISING HEAT DISSIPATION STRUCTURE

CROSS-REFERENCE TO RELATED APPLICATIONS

This application is a continuation of International Application No. PCT/KR2022/014144 designating the United States, filed on Sep. 22, 2022, in the Korean Intellectual Property Receiving Office and claims priority to Korean Patent Application No. 10-2021-0128315 filed on Sep. 28, 2021, in the Korean Intellectual Property Office, the contents of which are incorporated herein by reference.

BACKGROUND

Technical Field

An example of the disclosure relates to an electronic device including a heat radiating structure.

Description of Related Art

The term "electronic device" may mean a device performing a particular function according to its equipped program, such as a home appliance, an electronic scheduler, a portable multimedia player, a mobile communication terminal, a tablet PC, a video/sound device, a desktop PC or laptop computer, a navigation for automobile, etc. For example, electronic devices may output stored information as voices or images. As electronic devices are highly integrated, and high-speed, high-volume wireless communication becomes commonplace, an electronic device, such as a mobile communication terminal, is recently being equipped with various functions. For example, an electronic device comes with the integrated functionality, including an entertainment function, such as playing video games, a multimedia function, such as replaying music/videos, a communication and security function for mobile banking, and a scheduling and e-wallet function. Such electronic devices become compact enough for users to carry in a convenient way.

DETAILED DESCRIPTION OF THE INVENTION

Technical Solution

Various heat sources (e.g., application processors) may exist inside the electronic device. In such an environment, a heat dissipation structure for dispersing the heat generated from a heat source may be required. The heat generated from the heat source needs to be transferred to an internal component (e.g., a battery) of the electronic device having a relatively large heat capacity, and a heat transfer path to a thermally efficient component needs to be provided.

According to an example of the disclosure, there may be provided an electronic device including a vapor chamber that thermally mediates between a heat source and a battery.

According to an example of the disclosure, there may be provided an electronic device capable of effectively transferring heat from a vapor chamber to a battery by placing a filling member between the vapor chamber and the battery.

The disclosure is not limited to the foregoing example but various modifications or changes may rather be made thereto without departing from the spirit and scope of the disclosure.

According to an example of the disclosure, an electronic device may comprise a bracket including a first area, a second area partitioned from the first area, and a heat dissipation area formed from a portion of the first area to a portion of the second area; a circuit board including a heat source and disposed in the first area; a battery disposed in the second area; a vapor chamber disposed in the heat dissipation area and including a first portion disposed to face the heat source and a second portion disposed to face the battery to provide a transfer path of heat generated from the heat source; and a filling member applied between the second area and the battery to transfer the heat from the vapor chamber to the battery. The vapor chamber may include a buffer area formed in an edge area to accommodate the filling member.

According to an example of the disclosure, there may be provided a method for manufacturing an electronic device including a heat dissipation structure comprising preparing a bracket including a first area, a second area partitioned from the first area, and a heat dissipation area formed from a portion of the first area to a portion of the second area; a circuit board including a heat source and disposed in the first area; a battery; and a vapor chamber disposed in the heat dissipation area and including a first portion disposed to face the heat source and a second portion disposed adjacent to the first portion to provide a transfer path of heat generated from the heat source; applying a filling member to the second portion; and disposing the battery on the filling member; wherein the vapor chamber includes a buffer area formed in an edge area to accommodate the filling member pressed by the battery.

According to an example of the disclosure, the vapor chamber may be disposed to extend from the heat source to the battery, effectively dispersing the heat generated from the heat source.

According to an example of the disclosure, the filling member with high thermal efficiency may be applied between the battery and the vapor chamber, effectively transferring heat from the vapor chamber to the battery.

MODE FOR CARRYING OUT THE INVENTION

Figure 1:
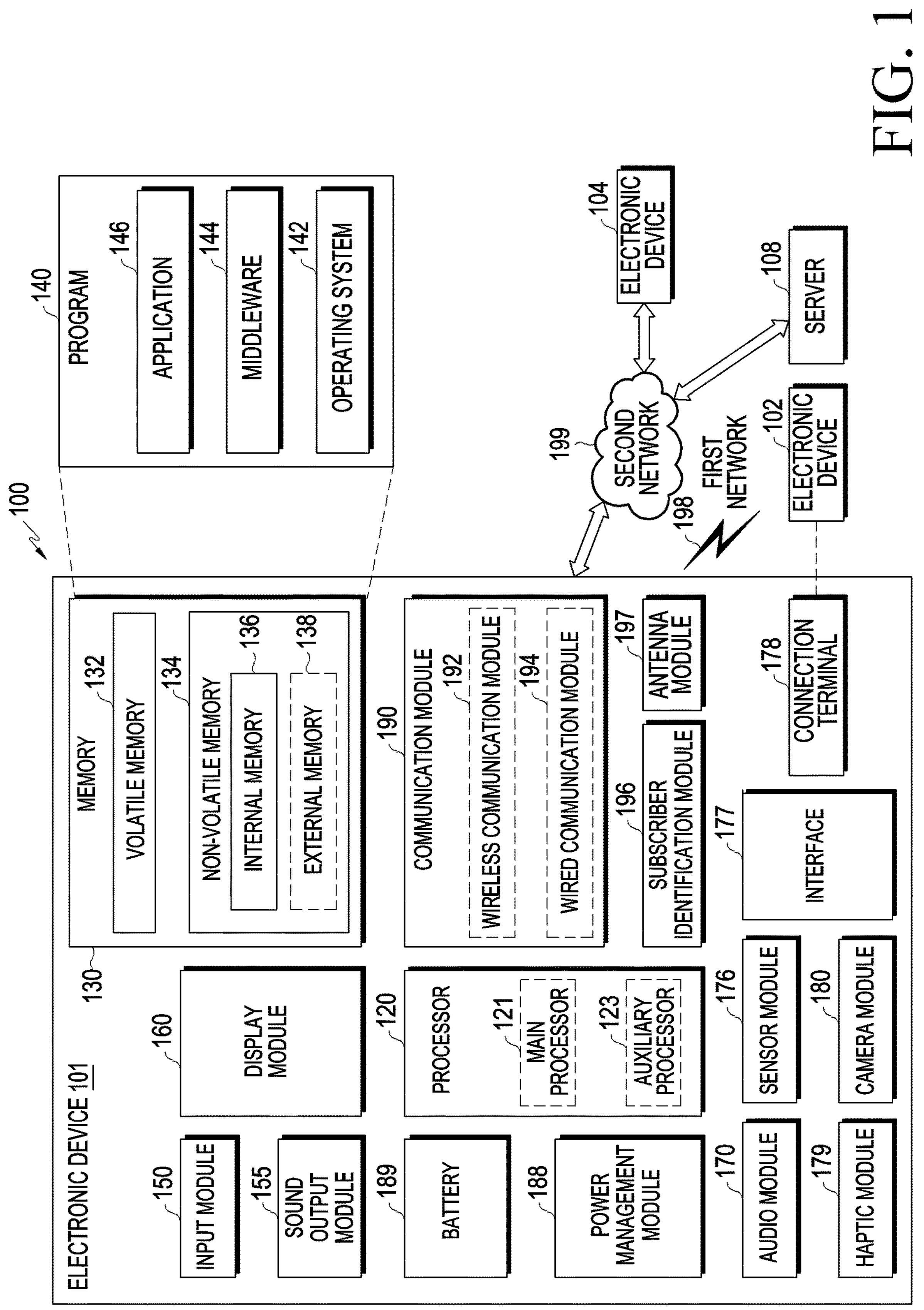
FIG. 1 is a block diagram illustrating an electronic device in a network environment according to an example of the disclosure.

FIG. 1 is a block diagram illustrating an electronic device in a network environment according to an example of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an example, the electronic device 101 may communicate with the electronic device 104 via the server 108. According to an example, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some example, at least one (e.g., the connecting terminal 178) of the components may be omitted from the electronic device 101, or one or more other components may be added in the electronic device 101. According to an example, some (e.g., the sensor module 176, the camera module 180, or the antenna module 197) of the components may be integrated into a single component (e.g., the display module 160). The processor 120 may execute, for example, software (e.g., a program 140) to control at least one other component (e.g., a hardware or software component) of the electronic device 101 coupled with the processor 120, and may perform various data processing or computation. According to one example, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an example, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an example, the auxiliary processor 123 (e.g., an image signal processor or a communication processor) may be implemented as part of another component (e.g., the camera module 180 or the communication module 190) functionally related to the auxiliary processor 123. According to an example, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an example, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an example, the display 160 may include a touch sensor configured to detect a touch, or a pressure sensor configured to measure the intensity of a force generated by the touch.

The audio module 170 may convert a sound into an electrical signal and vice versa. According to an example, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an example, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an example, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an example, the haptic module 179 may include, for example, a motor, a piezoelectric element, or an electric stimulator.

The camera module 180 may capture a still image or moving images. According to an example, the camera module 180 may include one or more lenses, image sensors, image signal processors, or flashes.

The power management module 188 may manage power supplied to the electronic device 101. According to one example, the power management module 188 may be implemented as at least part of, for example, a power management integrated circuit (PMIC).

The battery 189 may supply power to at least one component of the electronic device 101. According to an example, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an example, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an example, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an example, the antenna module may include an antenna including a radiator formed of a conductor or conductive pattern formed on a substrate (e.g., a printed circuit board (PCB)). According to an example, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an example, other parts (e.g., radio frequency integrated circuit (RFIC)) than the radiator may be further formed as part of the antenna module 197.

According to an example, the antenna module 197 may form a mmWave antenna module. According to an example, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example, commands or data may be transmitted or received between the electronic device 101 and the external electronic device 104 via the server 108 coupled with the second network 199. The external electronic devices 102 or 104 each may be a device of the same or a different type from the electronic device 101. According to an example, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an example, the external electronic device 104 may include an Internet-of-things (IoT) device. The server 108 may be an intelligent server using machine learning and/or a neural network. According to an example, the external electronic device 104 or the server 108 may be included in the second network 199. The electronic device 101 may be applied to intelligent services (e.g., smart home, smart city, smart car, or health-care) based on 5G communication technology or IoT-related technology.

The electronic device according to an example of the disclosure may be one of various types of electronic devices. The electronic devices may include, for example, a portable communication device (e.g., a smart phone), a computer device, a portable multimedia device, a portable medical device, a camera, a wearable device, or a home appliance. According to an example of the disclosure, the electronic devices are not limited to those described above.

It should be appreciated that an example of the present disclosure and the terms used therein are not intended to limit the technological features set forth herein to particular example and include various changes, equivalents, or replacements for a corresponding example. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an example, the module may be implemented in a form of an application-specific integrated circuit (ASIC).

According to an example, each component (e.g., a module or a program) of the above-described components may include a single entity or multiple entities. Some of the plurality of entities may be separately disposed in different components. According to an example, one or more of the above-described components may be omitted, or one or more other components may be added. Alternatively or additionally, a plurality of components (e.g., modules or programs) may be integrated into a single component. In such a case, according to an example, the integrated component may still perform one or more functions of each of the plurality of components in the same or similar manner as they are performed by a corresponding one of the plurality of components before the integration. According to an example, operations performed by the module, the program, or another component may be carried out sequentially, in parallel, repeatedly, or heuristically, or one or more of the operations may be executed in a different order or omitted, or one or more other operations may be added.

Figure 2:
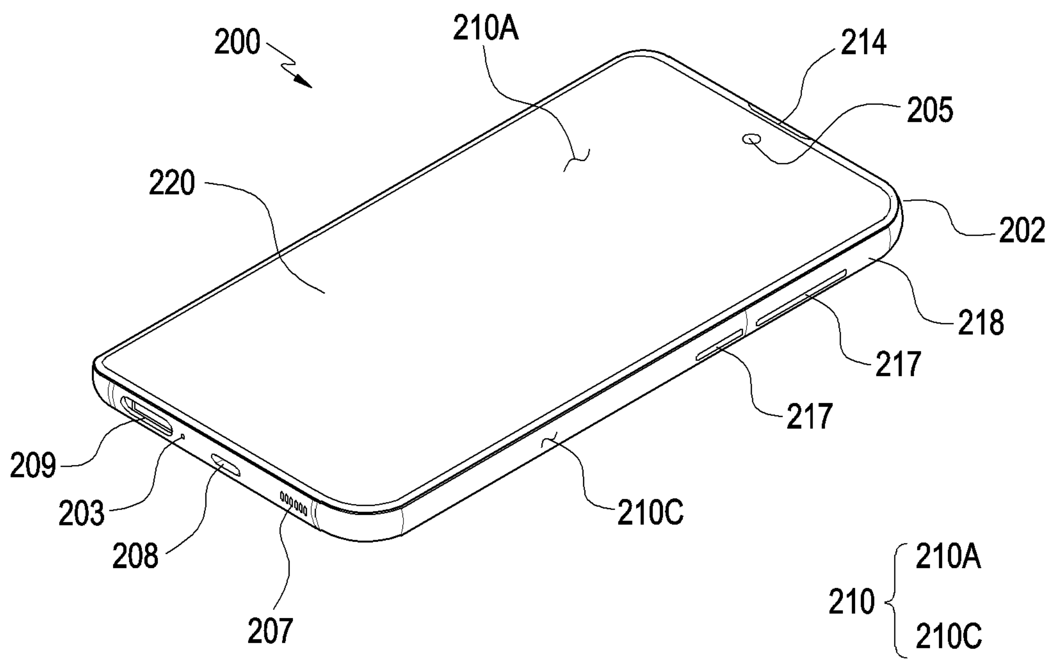
FIG. 2 is a front perspective view illustrating an electronic device according to an example of the disclosure.
Figure 3:
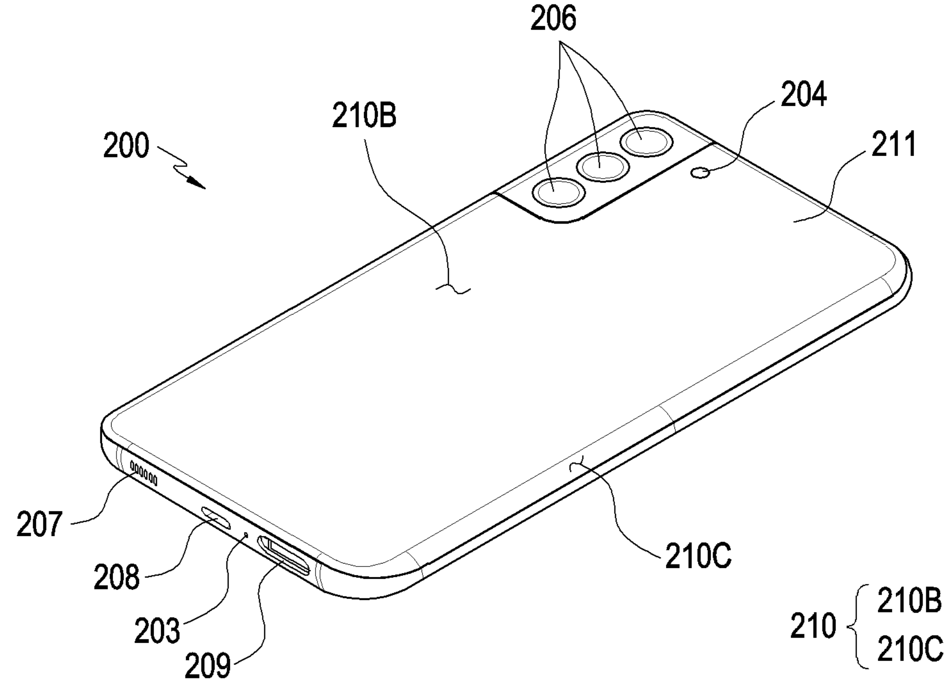
FIG. 3 is a rear perspective view illustrating an electronic device according to an example of the disclosure.

FIG. 2 is a front perspective view illustrating an electronic device according to an example of the disclosure. FIG. 3 is a rear perspective view illustrating an electronic device according to an example of the disclosure.

Referring to FIGS. 2 and 3, according to an example, an electronic device 200 may include a housing 210 with a front surface 210A, a rear surface 210B, and a side surface 210C surrounding a space between the front surface 210A and the rear surface 210B. According to an example (not shown), the housing 210 may denote a structure forming a part of the front surface 210A, the rear surface 210B, and the side surface 210C of FIG. 2. For example, the housing 210 may include a front plate 202 and a rear plate 211. According to an example, at least part of the front surface 210A may have a substantially transparent front plate 202 (e.g., a glass plate or polymer plate including various coat layers). The rear surface 210B may be formed by a rear plate 211. The rear plate 211 may be formed of, e.g., glass, ceramic, polymer, metal (e.g., titanium (Ti), stainless steel (STS), aluminum (Al), or magnesium (Mg)), or a combination of at least two thereof. The side surface 210C may be formed by a side bezel structure (or a "side member") 218 that couples to the front plate 202 and the rear plate 211 and includes a metal and/or polymer. According to an example, the rear plate 211 and the side bezel plate 218 may be integrally formed together and include the same material (e.g., glass, metallic material such as aluminum, or ceramic). According to an example, the front surface 210A and/or the front plate 202 may be interpreted as a part of the display 220.

According to an example, the electronic device 200 may include at least one of a display 220, audio modules 203, 207, and 214 (e.g., the audio module 170 of FIG. 1), a sensor module (e.g., the sensor module of FIG. 1). 176), camera modules 205 and 206 (e.g., the camera module 180 of FIG.

1), a key input device 217 (e.g., the input module 150 of FIG. 1), and connector holes 208 and 209 (e.g., the connection terminal 178 of FIG. 1). According to an example, the electronic device 200 may exclude at least one of the components (e.g., the connector hole 209) or may add other components. According to an example, the display 220 may be visually revealed, e.g., through a majority portion of the front plate 202.

According to an example, the surface (or the front plate 202) of the housing 210 may include a screen display area formed as the display 220 is visually exposed. For example, the screen display area may include the front surface 210A.

According to an example (not shown), the electronic device 200 may include a recess or opening formed in a portion of the screen display area (e.g., the front surface 210A) of the display 220 and may include at least one or more of an audio module 214, a sensor module (not shown), a light emitting device (not shown), and a camera module 205 aligned with the recess or opening. According to an example (not shown), at least one or more of the audio module 214, sensor module (not shown), camera module 205, fingerprint sensor (not shown), and light emitting device (not shown) may be included on the rear surface of the screen display area of the display 220.

According to an example (not shown), the display 220 may be disposed to be coupled with or adjacent to, a touch detecting circuit, a pressure sensor capable of measuring the strength (pressure) of touches, and/or a digitizer for detecting a magnetic field-type stylus pen.

According to an example, at least a portion of the key input device 217 may be disposed on the side bezel structure 218.

According to an example, the audio modules 203, 207, and 214 may include, e.g., a microphone hole 203 and speaker holes 207 and 214. The microphone hole 203 may have a microphone inside to obtain external sounds. According to an example, there may be a plurality of microphones to be able to detect the direction of a sound. The speaker holes 207 and 214 may include an external speaker hole 207 and a phone receiver hole 214. According to an example, the speaker holes 207 and 214 and the microphone hole 203 may be implemented as a single hole, or a speaker may be included without the speaker holes 207 and 214 (e.g., piezo speakers).

According to an example, the sensor modules (not shown) may generate an electrical signal or data value corresponding to an internal operating state or external environmental state of the electronic device 200. The sensor module (not shown), for example, may include first sensor module (not shown) (e.g., a proximity sensor) and/or a second sensor module (not shown) (e.g., a fingerprint sensor) disposed on the front surface 210A of the housing 210. The sensor module (not shown) may include a third sensor module (not shown) (e.g., an HRM sensor) and/or a fourth sensor module (not shown) (e.g., a fingerprint sensor) disposed on the rear surface 210B of the housing 210). In an example (not shown), the fingerprint sensor may be disposed on the rear surface 210B as well as on the front surface 210A (e.g., the display 220) of the housing 210. The electronic device 200 may further include sensor modules not shown, e.g., at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor (not shown).

According to an example, the camera modules 205 and 206 may include a front camera module 205 disposed on the first surface 210A of the electronic device 200 and a rear camera module 206 and/or a flash 204 disposed on the rear surface 210B. The camera modules 205 and 206 may include one or more lenses, an image sensor, and/or an image signal processor. The flash 204 may include, e.g., a light emitting diode (LED) or a xenon lamp. According to an example, two or more lenses (an infrared (IR) camera, a wide-angle lens, and a telephoto lens) and image sensors may be disposed on a single surface of the electronic device 200.

According to an example, the key input device 217 may be disposed on the side surface 210C of the housing 210. According to an example, the electronic device 200 may exclude all or some of the above-mentioned key input devices 217 and the excluded key input devices 217 may be implemented in other forms, e.g., as soft keys, on the display 220.

According to an example, the light emitting device may be disposed on, e.g., the front surface 210A of the housing 210. The light emitting device (not shown) may provide, e.g., information about the state of the electronic device 200 in the form of light. According to an example, the light emitting device (not shown) may provide a light source that interacts with, e.g., the front camera module 205. The light emitting device (not shown) may include, e.g., a light emitting diode (LED), an infrared (IR) LED, and/or a xenon lamp.

According to an example, the connector holes 208 and 209 may include a first connector hole 208 for receiving a connector (e.g., an earphone jack) for transmitting/receiving audio signals to/from an external electronic device or a connector (e.g., a USB connector) for transmitting/receiving power and/or data to/from the external electronic device and/or a second connector hole 209 for receiving a storage device (e.g., a subscriber identification module (SIM) card). According to an example, the first connector hole 208 and/or the second connector hole 209 may be omitted.

Figure 4:
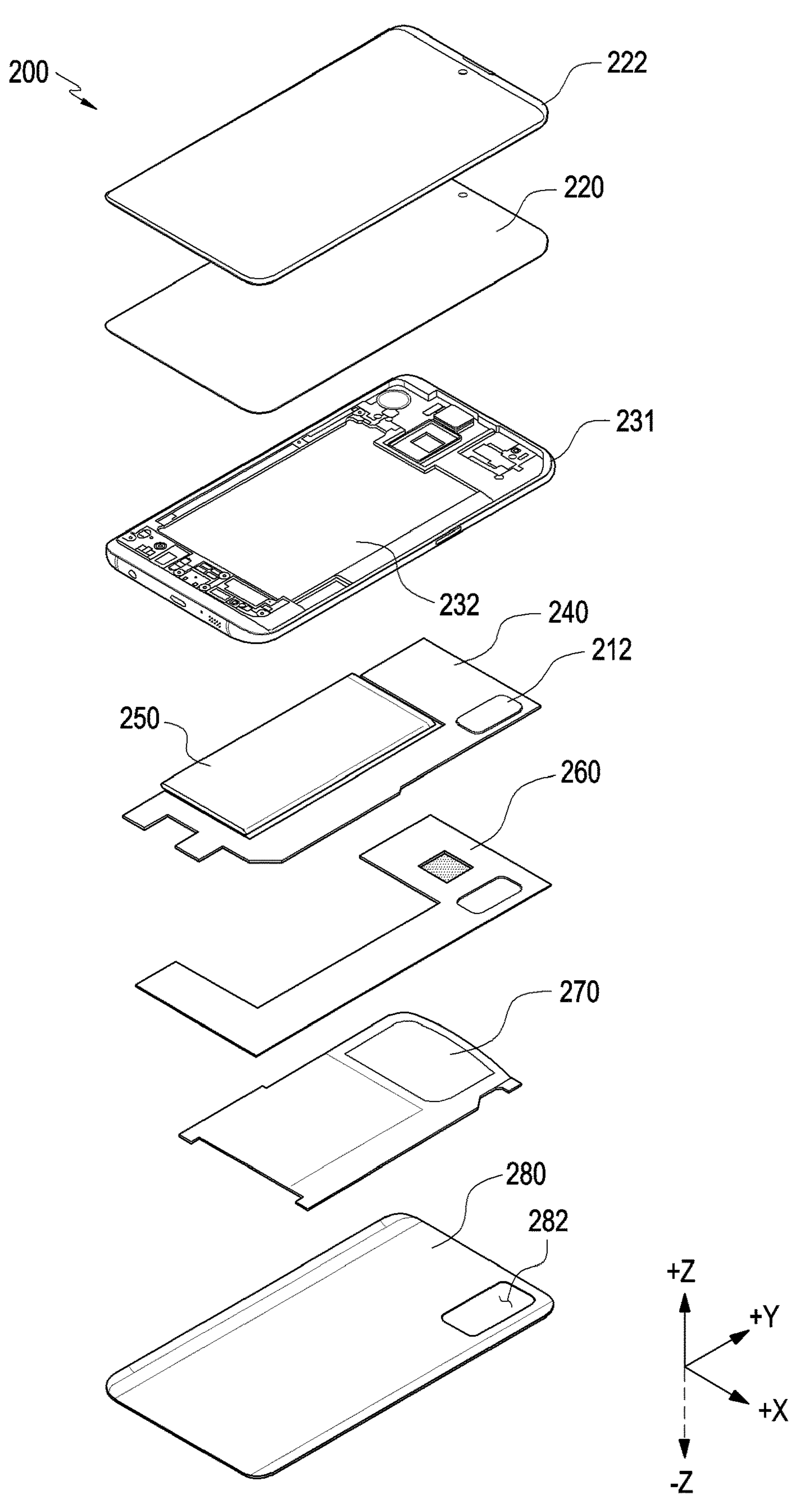
FIG. 4 is an exploded perspective view illustrating an electronic device according to an example of the disclosure.

FIG. 4 is an exploded perspective view illustrating an electronic device according to an example of the disclosure.

Referring to FIG. 4, an electronic device 200 (e.g., the electronic device 200 of FIGS. 2 and 3) may include at least one of a front plate 222 (e.g., the front plate 202 of FIG. 2), a display 220. (e.g., the display 220 of FIG. 2), a bracket 232 (e.g., a front supporting member), a printed circuit board 240, a battery 250, a rear case 260 (e.g., a rear supporting member), an antenna 270, and a rear plate 280 (e.g., the rear plate 211 of FIG. 3). According to an example, the electronic device 200 may exclude at least one (e.g., the rear case 260) of the components or may add other components. At least one of the components of the electronic device 200 may be the same or similar to at least one of the components of the electronic device 200 of FIG. 2 or 3 and no duplicate description is made below.

According to an example, the bracket 232 may be disposed inside the electronic device 200 to be connected with the side bezel structure 231 or integrated with the side bezel structure 231. The bracket 232 may be formed of, e.g., a metal and/or non-metallic material (e.g., polymer). The bracket 232 may accommodate the display 220 on one surface and the printed circuit board 240 on the other surface. A processor (e.g., the processor 120 of FIG. 1), a memory (e.g., the memory 130 of FIG. 1), and/or an interface (e.g., the interface 177 of FIG. 1) may be mounted on the printed circuit board 240.

According to an example, the battery 250 may be a device for supplying power to at least one component (e.g., the camera module212) of the electronic device 200. The battery

250 may include, e.g., a primary cell which is not rechargeable, a secondary cell which is rechargeable, or a fuel cell. At least a portion of the battery 250 may be disposed on substantially the same plane with the printed circuit board 240. The battery 250 may be integrally or detachably disposed inside the electronic device 200.

According to an example, the rear case 260 may be disposed between the printed circuit board 240 and the antenna 270. For example, the rear case 260 may include one surface to which at least one of the printed circuit board 240 and the battery 250 is coupled, and another surface to which the antenna 270 is coupled.

According to an example, the antenna 270 may be disposed between the rear plate 280 and the battery 250. The antenna 270 may include, e.g., a near-field communication (NFC) antenna, a wireless charging antenna, and/or a magnetic secure transmission (MST) antenna. The antenna 270 may perform short-range communication with, e.g., an external device or may wirelessly transmit or receive power necessary for charging. For example, the antenna 270 may include a coil for wireless charging. According to an example, an antenna structure may be formed by a portion or combination of the side bezel structure 231 and/or the bracket 232.

According to an example, the electronic device 200 may include a camera module 212 disposed in the second housing (e.g., the housing 210 of FIG. 2). According to an example, the camera module 212 may be disposed on the bracket 232 and may be a rear camera module (e.g., the camera module 212 of FIG. 3) capable of obtaining an image of a subject positioned behind (e.g., the −Z direction) of the electronic device 200. According to an example, at least a portion of the camera module 212 may be exposed to the outside of the electronic device 200 through the opening 282 formed in the rear plate 280.

The electronic device 200 disclosed in FIGS. 2 to 4 has a bar-type or plate-type appearance but the disclosure is not limited thereto. For example, the illustrated electronic device may be a rollable electronic device or a foldable electronic device (e.g., the electronic device 500 of FIG. 12). "Rollable electronic device" may mean an electronic device at least a portion of which may be wound or rolled or received in a housing (e.g., the housing 210 of FIG. 2) as the display (e.g., the display 220 of FIG. 4) may be capable of being bent and deformed. As the display is stretched out or is exposed to the outside in a larger area according to the user's need, the rollable electronic device may use an expanded second display area.

Figure 5:
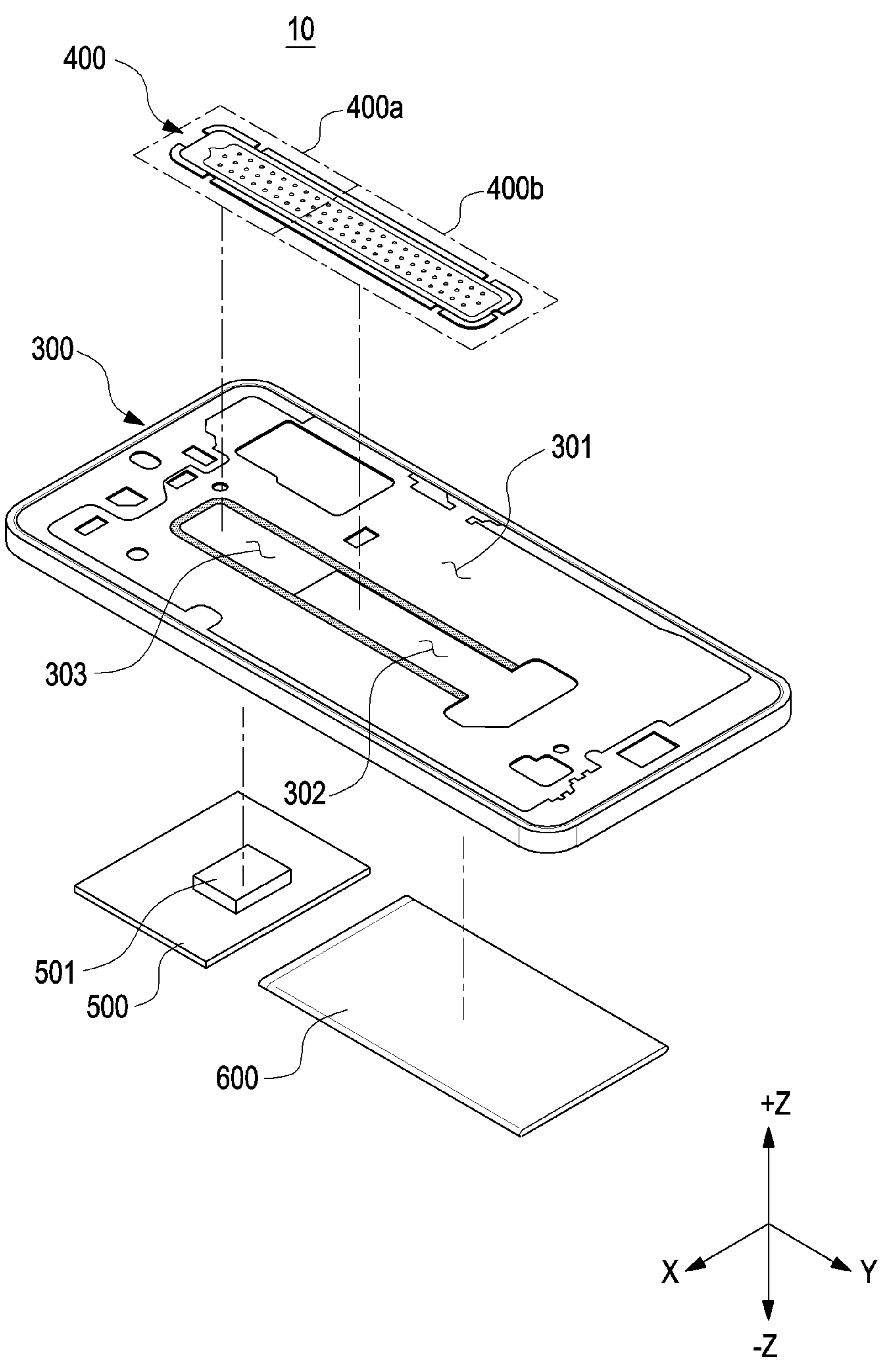
FIG. 5 is an exploded perspective view schematically illustrating a heat dissipation structure, according to an example of the disclosure.

According to an example, the electronic device 200 may include a heat dissipation structure (e.g., the heat dissipation structure 10 of FIGS. 5 to 12) for dissipating the heat generated from an internal heat source (e.g., the heat source 501 of FIG. 5). According to an example, the heat dissipation structure 10 may be provided as an arrangement and combination of a bracket 232 and additional components (e.g., the vapor chamber 400 of FIGS. 5 to 12, the battery 250, and a filling member (e.g., the filling member 650 of FIG. 12).

In the following description of the disclosure, the above-described heat dissipation structure 10 is described with reference to the drawings.

Figure 6:
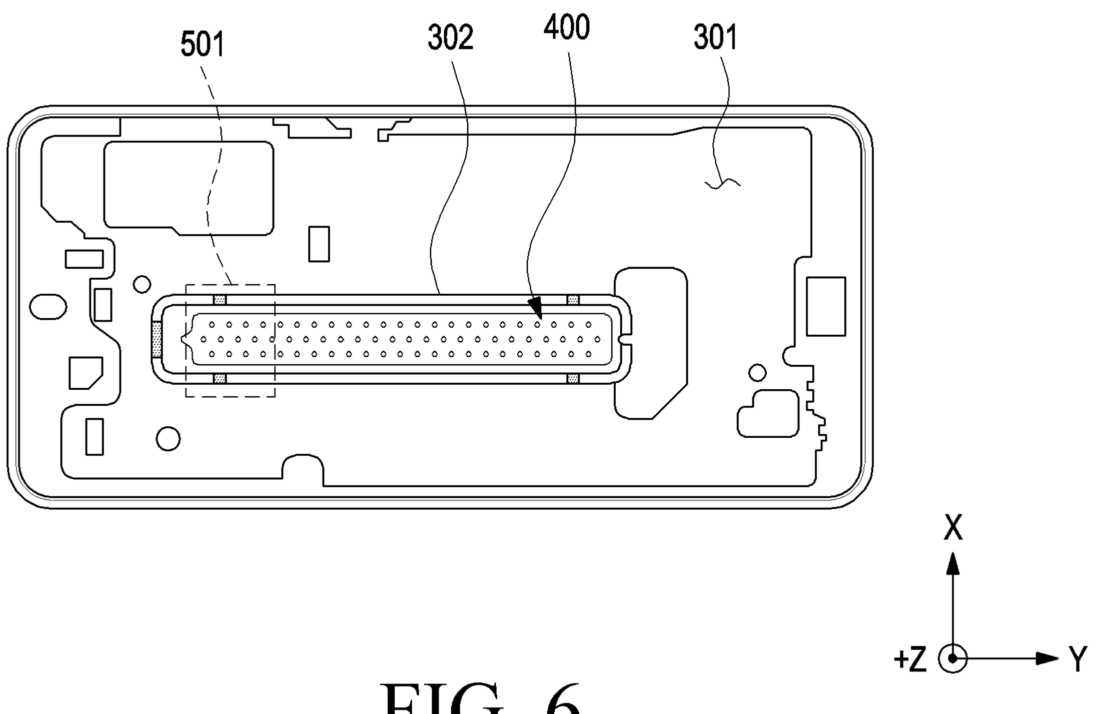
FIG. 6 is a top view illustrating a heat dissipation structure according to an example.
Figure 7:
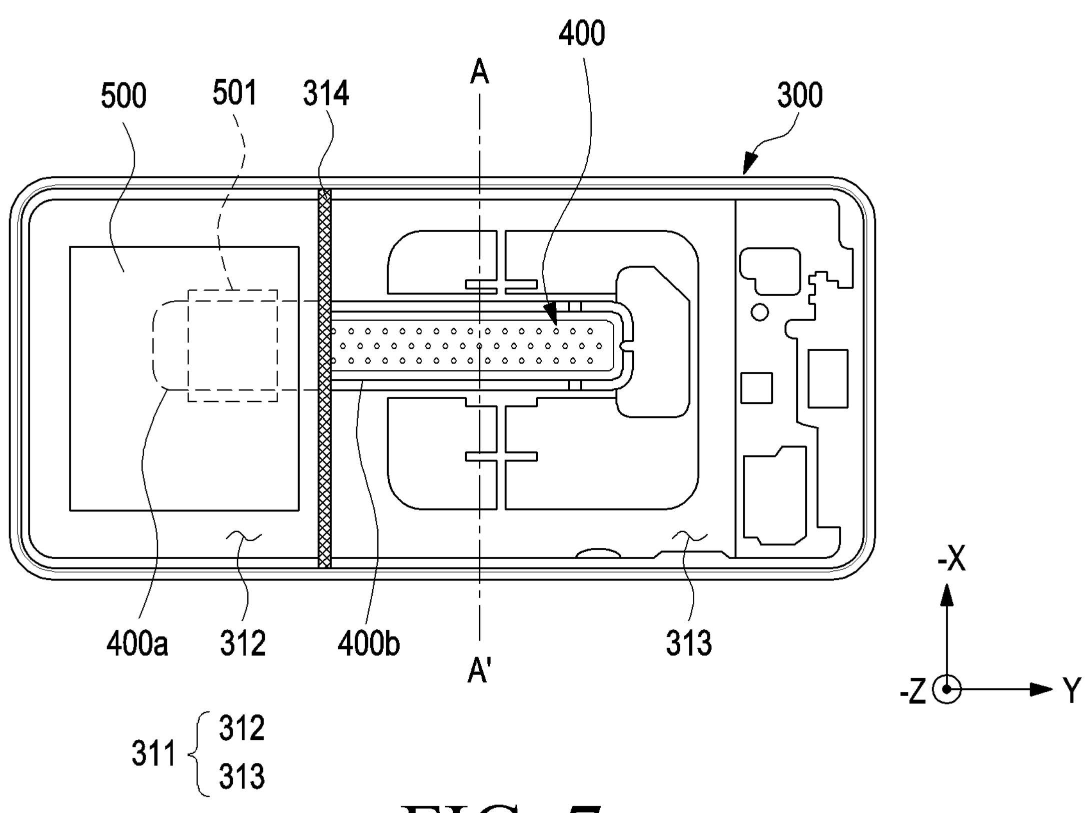
FIG. 7 is a rear view illustrating a heat dissipation structure according to an example.

FIG. 5 is an exploded perspective view schematically illustrating a heat dissipation structure, according to an example of the disclosure. FIG. 6 is a top view illustrating a heat dissipation structure according to an example. FIG. 7 is a rear view illustrating a heat dissipation structure according to an example.

Referring to FIGS. 5 to 7, the electronic device (e.g., the electronic device 200 of FIGS. 2 to 4) may include a heat dissipation structure 10. The heat dissipation structure 10 may include a bracket 300, a vapor chamber 400, a circuit board 500, and a battery 600, and be provided as a combination thereof. The description of the bracket 300, the battery 600, and the circuit board 500 of FIGS. 5 to 7 may be identical in whole or part to the bracket 232 (refer to FIG. 4), the battery 250 (refer to FIG. 4), and the printed circuit board 240 (refer to FIG. 4) of FIGS. 2 to 4.

According to an example, the vapor chamber 400 may be disposed on the first surface 301 (the surface in the +z-axis direction) of the bracket 300. According to an example, a receiving area 302 may be formed in a portion of the first surface 301, and the vapor chamber 400 may be disposed in the receiving area 302. For example, the receiving area 302 may be formed as an opening in a portion of the first surface 301. As heat is transferred through the vapor chamber 400 disposed in the receiving area 302, the receiving area 302 may also be referred to as a heat dissipation area 302. In the following description of the disclosure, the terms receiving area 302 and heat dissipation area 302 may be used interchangeably.

According to an example, a heat transfer portion 303 may be formed in a portion of the receiving area 302. As is described below, the heat generated from the heat source (e.g., the heat source 501 in FIG. 12) may be transferred to the vapor chamber 400 through the heat transfer portion 303. Further, the heat transfer portion 303 may refer to a rear surface (the surface in the +z-axis direction) of a first area (e.g., the first area 312 of FIG. 7) to be described below.

According to an example, the circuit board 500 may be disposed on the second surface 311 (refer to FIG. 7) of the bracket 300. For example, the circuit board 500 may be disposed in the first area 312. According to an example, the circuit board 500 may include a heat source 501. The heat source 501 may refer to a component that is disposed on the circuit board 500 and generates heat when operated. As an example, the heat source 501 may be at least one of, but not limited to, a power management integrated circuit (PMIC), a power amplifier (PAM), an application processor (AP), a communication processor (CP), a charger integrated circuit (IC), a display driver integrated circuit (DDI), or a communication circuit (e.g., a transceiver, an active communication device, or a passive communication device).

According to an example (referring to FIG. 7), the second surface 311 (the surface in the −z-axis direction) of the bracket 300 may include a first area 312 and a second area 313. According to an example, the first area 312 and the second area 313 may be partitioned through a barrier unit 314. According to an example, the circuit board 500 including the heat source 501 may be disposed in the first area 312. Further, the battery 600 may be disposed in the second area 313.

According to an example, the receiving area 302 may be formed to be connected to the first area 312 and the second area 313. For example, a portion of the receiving area 302 may be formed in the first area 312, and another portion thereof may be formed in the second area 313. As an example, the receiving area 302 may extend from at least a portion of the first area 312 to the second area 313. This allows the vapor chamber 400 disposed in the receiving area 302 to transfer heat from the first area 312 to the second area 313 or vice versa.

According to an example (referring to FIG. 7), the heat source 501 may be disposed in the first area 312 to correspond to at least a portion of the vapor chamber 400. A portion of the vapor chamber 400 disposed in the first area 312 to correspond to the heat source 501 may be the first portion 400*a*. For example, the heat source 501 may be disposed to face the first portion 400*a* with the first area 312 interposed therebetween. Accordingly, the heat generated from the heat source 501 may be transferred to the vapor chamber 400 through the first area 312. Further, as is described below, since the battery 600 is disposed in the second area 313, the vapor chamber 400 may transfer heat to the battery 600. A filling member (e.g., the filling member 650 of (b) of FIG. 9) may be disposed between a portion of the vapor chamber 400 (hereinafter, referred to as the second portion 400*b*) disposed in the second area 313 and the battery 600. The heat transferred from the heat source 501 through the filling member 650 may be transferred from the vapor chamber 400 to the battery 600. For example, the receiving area 302 corresponding to the first area 312 may be formed as a concave portion so that the heat source 501 and the vapor chamber 400 face each other with the bracket 300 interposed therebetween. Further, a portion of the receiving area 302 corresponding to the second area 313 may be formed as an opening, so that the vapor chamber 400 and the battery 600 may exchange heat via the filling member (e.g., the filling member 650 of (b) of FIG. 9).

Figure 8:
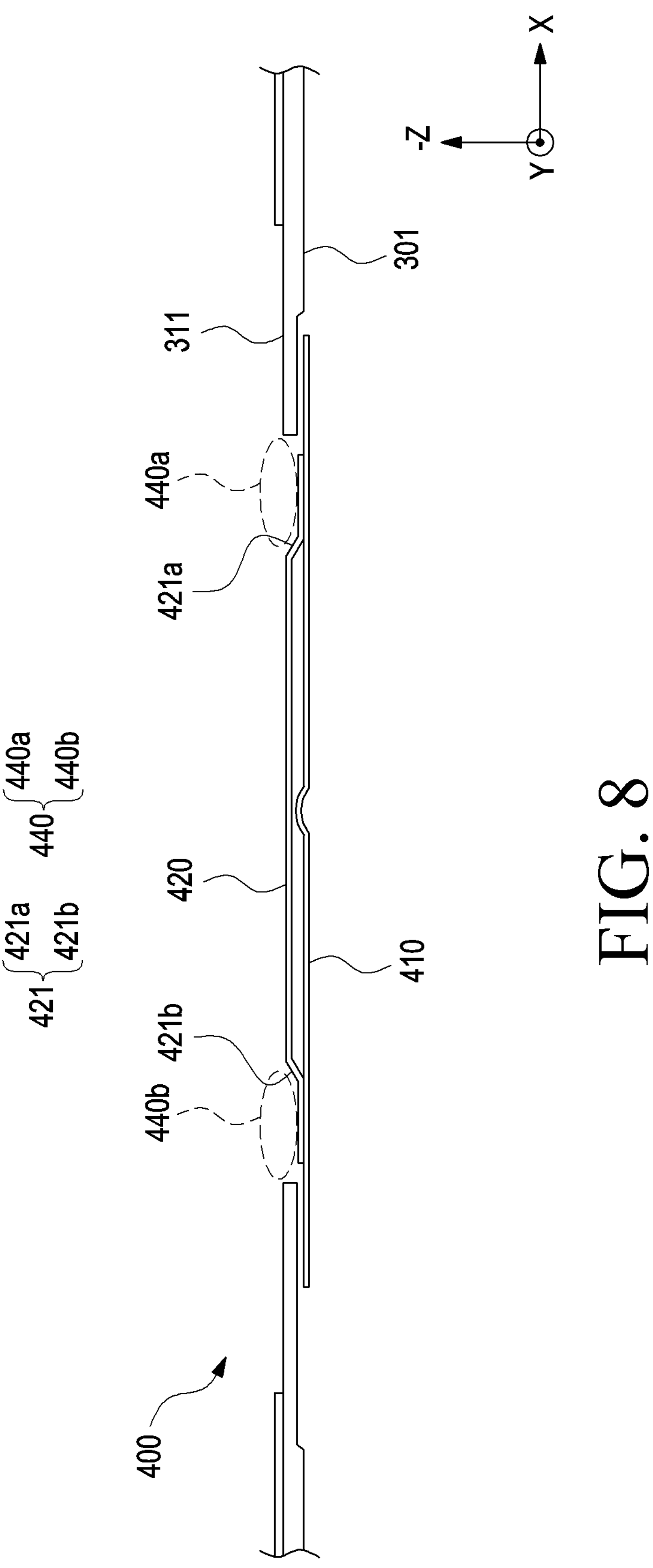
FIG. 8 is a cross-sectional view taken along A-A' of FIG. 7.

FIG. 8 is a cross-sectional view taken along A-A' of FIG. 7.

Referring to FIG. 8, the vapor chamber 400 may include a supporting portion 410 and a transfer portion 420 disposed on the supporting portion 410. The vapor chamber 400 of FIG. 8 may be identical in whole or part to the vapor chamber 400 of FIGS. 5 to 7.

According to an example, the width (length in the x-axis direction) of the supporting portion 410 may correspond to the width of the receiving area 302. For example, the width of the supporting portion 410 may be formed to be larger than the width of the receiving area 302, so that the vapor chamber 400 may be prevented from escaping off in the direction of the second surface 311 of the bracket 300 (−z-axis direction).

According to an example, the transfer portion 420 may include a bending portion 421. According to an example, the bending portion 421 may be formed in an edge area (the edge area in the x-axis direction) of the transfer portion 420. For example, the bending portions 421*a* and/or 421*b* may be formed in only one edge area of the transfer portion, or may be formed on two opposite edge areas of the transfer portion. According to an example, the bending portion 421 may be formed by bending a portion of the edge area of the transfer portion 420. For example, the bending portion 421 may be formed by bending or curving a portion of the transfer portion 420. According to an example, the bending portion 421 may be combined with the bracket 300 to provide buffer areas 440*a* and 440*b*. As is described below, the buffer area 440 may provide a space in which the filling member (e.g., the filling member 650 of FIG. 11) may be received.

Figure 9:
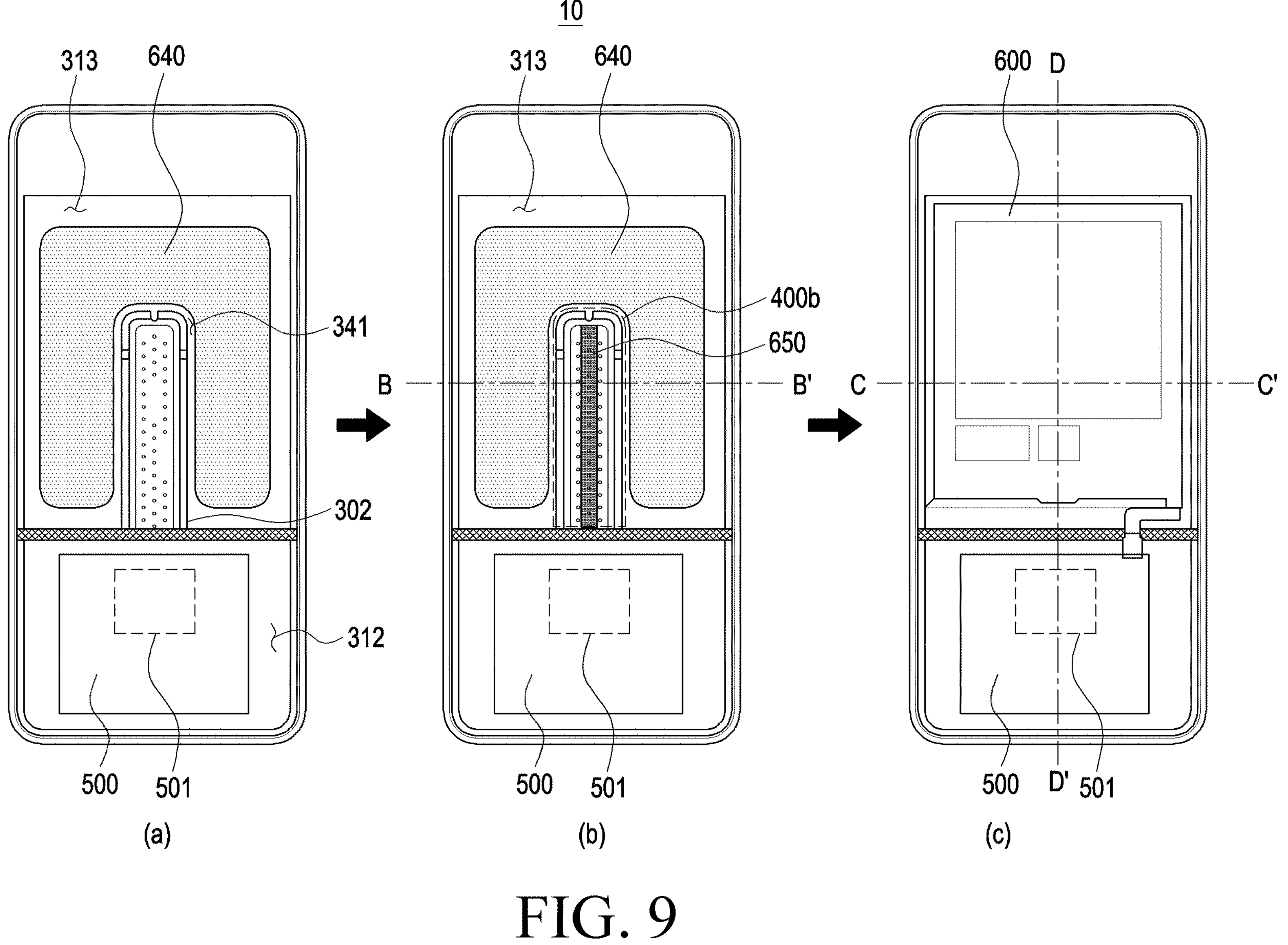
FIG. 9 is a view illustrating a process of assembling a heat dissipation structure according to an example.

FIG. 9 is a view illustrating a process of assembling a heat dissipation structure according to an example.

The heat dissipation structure 10 of FIG. 9 may be identical in whole or part to the heat dissipation structure 10 in the above-described example.

According to an example, an adhesive member 640 may be disposed in the second area 313. The battery 600 may be attached to the second area 313 through the adhesive member 640. According to an example, the adhesive member 640 may be disposed to surround the whole or part of the receiving area 302. According to an example, the adhesive member 640 may be disposed to be spaced apart from the receiving area 302. For example, the second area 313 may include a spaced area 341 around the receiving area 302. The adhesive member 640 may be spaced apart from the receiving area 302 by the width of the spaced area 341 and surround the receiving area 302.

According to an example, the filling member 650 may be disposed in the vapor chamber 400. Further, after the filling member 650 is disposed, the battery 600 may be disposed in the second area 313. For example, the filling member 650 may be disposed between the battery 600 and the second portion 400*b*. Further, the battery 600 may press the filling member 650 disposed on the second portion 400*b*. According to an example, the filling member may be formed of a material having high heat transfer efficiency. Further, the filling member may be a liquid or semi-solid state material. As an example, the filling member may include, but is not limited to, a resin, a gel-type thermal interface material (TIM), and a solid-state TIM. In other words, according to an example, the filling member may include liquid and/or semi-solid materials and may be interpreted as meaning any member that is disposed on the circuit board 500 and may perform the functions of rigidity reinforcement and heat dissipation of the components (e.g., the heat source 501) mounted on the circuit board 500.

Figure 10:
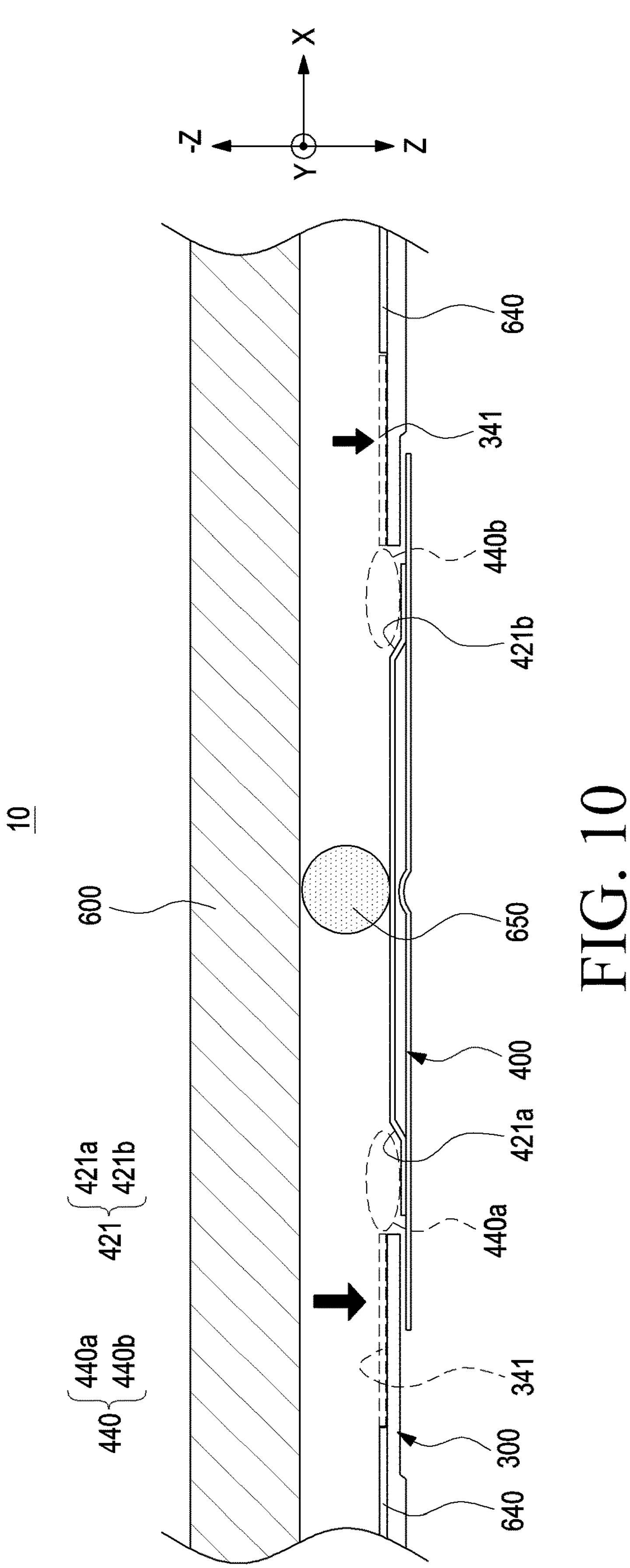
FIG. 10 is a cross-sectional view taken along B-B' of (b) of FIG. 9.
Figure 11:
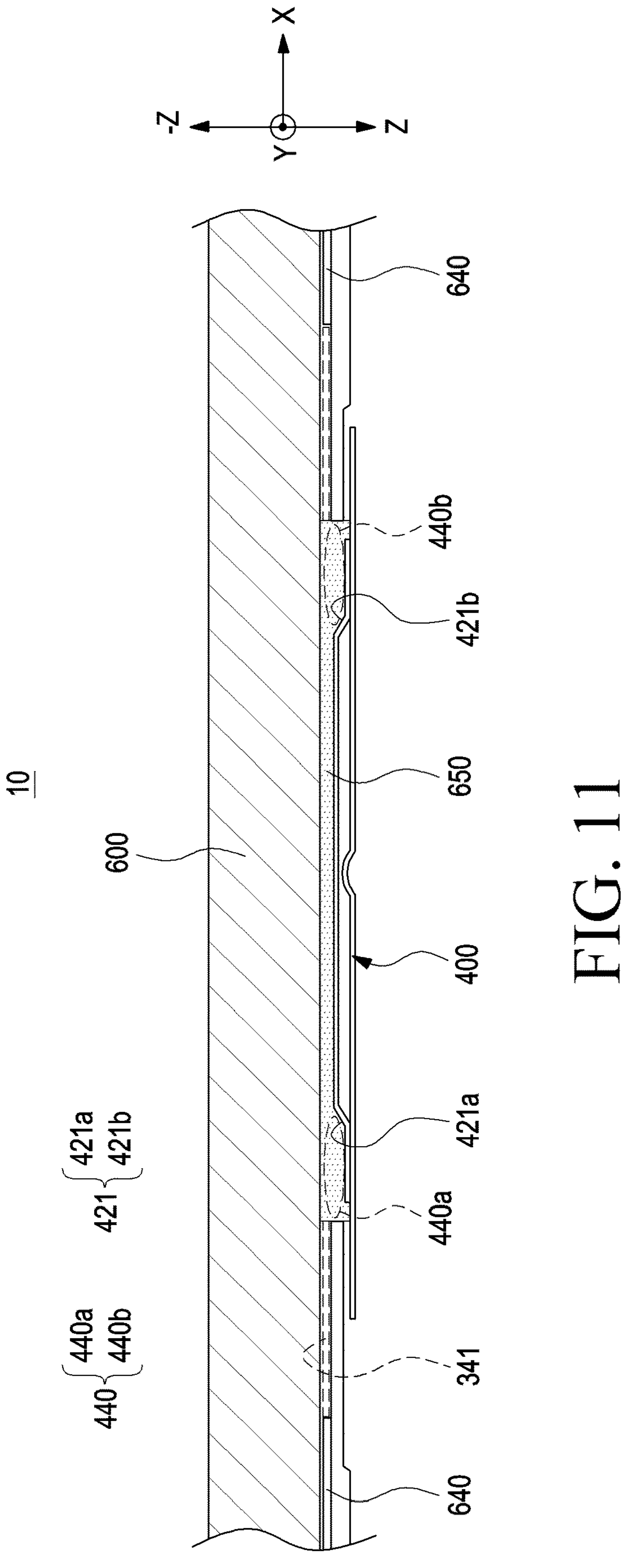
FIG. 11 is a cross-sectional view taken along C-C' of (c) FIG. 9.

FIG. 10 is a cross-sectional view taken along B-B' of (b) of FIG. 9. FIG. 11 is a cross-sectional view taken along C-C' of (c) of FIG. 9.

Referring to FIGS. 10 and 11, the filling member 650 pressed by the battery 600 may be spread on the vapor chamber 400. For the heat dissipation structure 10 of FIGS. 10 and 11, the description regarding the heat dissipation structure 10 of the above-mentioned example may apply.

According to an example, the filling member 650 may be disposed in the buffer area 440. For example, at least a portion of the filling member 650 pressed by the battery 600 may flow along the bending portion 421 to be applied to the buffer area 440. The buffer area 440 may suppress the filling member 650 from penetrating the second surface 311 of the bracket 300 and contacting the adhesive member 640.

According to an example, the spaced area 341 may be disposed adjacent to the buffer area 440. For example, the spaced area 341 may prevent the filling member 650, which overflows from the buffer area 440 and partially invades the second surface 311, from contacting the adhesive member 640. According to an example, as the contact between the filling member 650 having high heat transfer efficiency and the adhesive member 640 having high heat resistance is suppressed through the buffer area 440 and the spaced area 341, the heat dispersion efficiency of the vapor chamber 400 may be increased.

Figure 12:
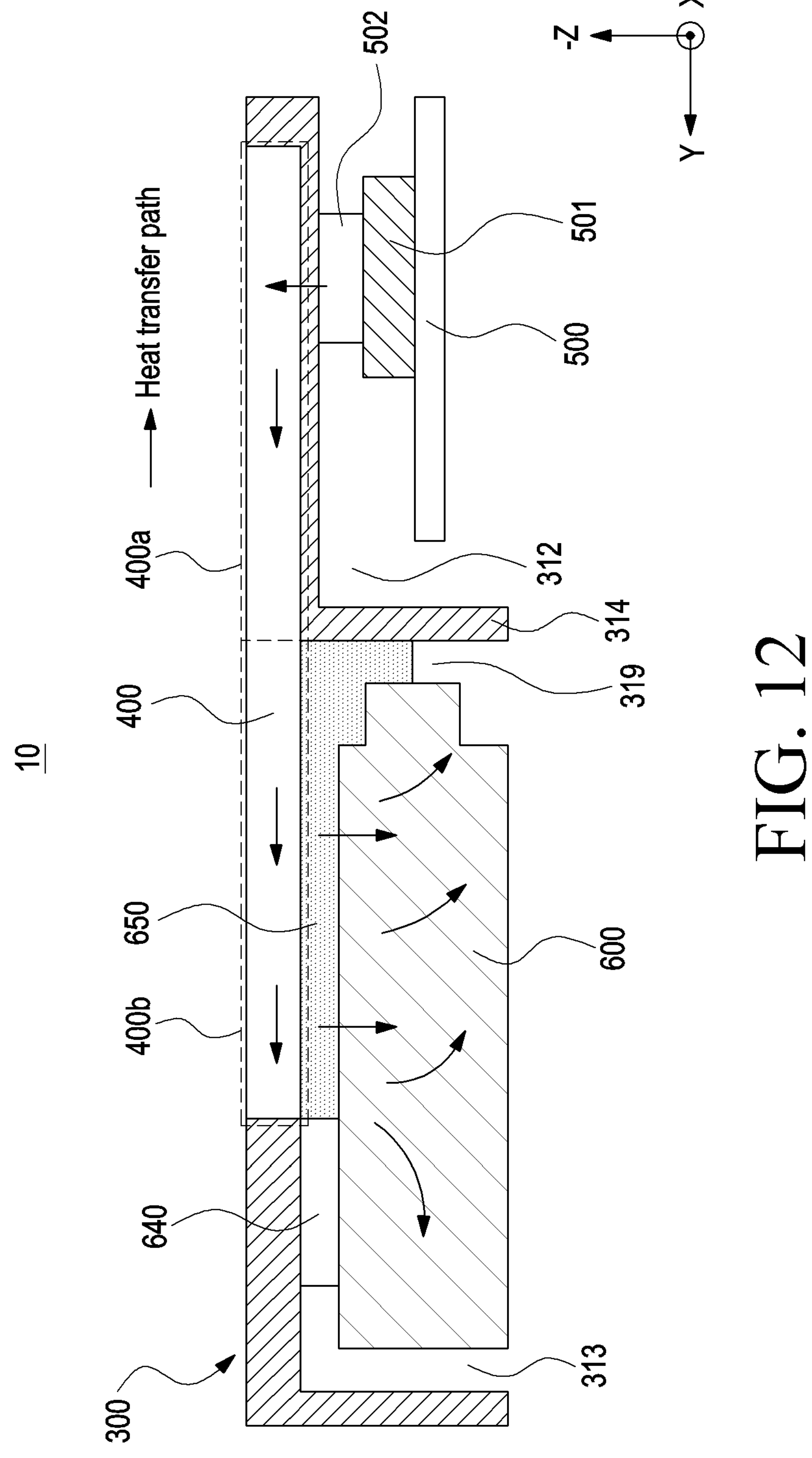
FIG. 12 is a cross-sectional view taken along D-D' of (c) of FIG. 9.

FIG. 12 is a cross-sectional view taken along D-D' of (c) FIG. 9.

Referring to FIG. 12, the vapor chamber 400 may provide a heat transfer path between the heat source 501 and the battery 600. For the heat dissipation structure 10 of FIG. 12, the description regarding the heat dissipation structure 10 of the above-mentioned example may apply.

Certain example of the present disclosure provide a heat dissipation structure 10 comprising one or more of the following features in any suitable combination.

Certain example of the present disclosure provides a heat dissipation structure 10 for dissipating heat comprising: a first component 501 that generates heat (e.g. a heat source); a second component 600 that stores and/or dissipates heat (e.g. a heat sink); and a heat transfer component 400 configured to transfer heat from the first component 501 to the second component 600 via a heat path. In the present disclosure, the first component 501, the second component 600, and a heat transfer component 400 may be referred to as the heat source 501, the battery 600, and the vapor chamber 400, respectively.

In certain example, heat emitted by the first component 501 may be transferred to the heat transfer component 400, transferred along the heat path in or on the heat transfer component 400, and transferred to the second component 600.

In certain example, the heat transfer component 400 may comprise a component (e.g. elongate component) having a first portion (e.g. first end) 400*a* located adjacent to the first component 501 and a second portion (e.g. second end) 400*b* located adjacent to the second component 600, wherein the heat path is a path on and/or through (e.g. along the length of) the heat transfer component 400 from the first portion 400*a* to the second portion 400*b*.

In certain example, the first component 501 may comprise a power management integrated circuit (PMIC), a power amplifier (PAM), an application processor (AP), a communication processor (CP), a charger integrated circuit (IC), a display driver integrated circuit (DDI), and/or a communication circuit (e.g., a transceiver, an active communication device, or a passive communication device).

In certain example, the second component 600 may comprise a battery.

In certain example, the heat transfer component 400 may comprise a vapor chamber.

In certain example, the heat dissipation structure 10 may further comprise a support component (e.g. a support plate) 300, wherein the first component 501, second component 600 and/or heat transfer component 400 may be connected (directly or indirectly) to the support component 300.

In certain example, the heat transfer component 400 may be connected (directly or indirectly) to a first side 301 of the support component 300.

In certain example, the first component 501 and the second component 600 may be connected (directly or indirectly) to a second side 311 of the support component 300 opposite the first side 301. In the present disclosure, the support component 300, the first side 301, and the second side 311 may be referred to as the bracket 300, the first surface 301 and the second surface 311, respectively.

In certain example, the heat dissipation structure 10 may comprise a first layer of thermally conductive material 502 between at least a portion of the first component 501 and at least a portion of the heat transfer component 400 to transfer heat from the first component 501 to the heat transfer component 400.

In certain example, at least a portion of the support component may be located between the first layer of thermally conductive material 502 and the heat transfer component 400.

In certain example, the heat dissipation structure 10 may comprise an adhesive (e.g. adhesive tape) 640 to attach the second component 600 to the support component 300.

In certain example, the heat dissipation structure 10 may comprise a second layer of thermally conductive material 650 between at least a portion of the second component 600 and at least a portion of the heat transfer component 400 to transfer heat from the heat transfer component 400 to the second component 600.

In the present disclosure, thermally conductive material 502, an adhesive 640, the second layer of thermally conductive material 650 may be referred to as auxiliary filling member 502, the adhesive member 640, and the filling member 650.

In certain example, the second layer of thermally conductive material 650 may be directly connected to at least a part of the second component 600.

In certain example, the second layer of thermally conductive material 650 may be directly connected to at least a part of the heat transfer component 400.

In certain example, the second layer of thermally conductive material 650 may be connected to the second portion (e.g. second end) 400*b* of the heat transfer component 400 located adjacent to the second component 600.

In certain example, the second layer of thermally conductive material 650 may be connected to at least a part of the heat transfer component 400 through a gap or opening in the support component 300.

In certain example, the gap or opening in the support component 300 may be located at a position adjacent to the second portion (e.g. second end) 400*b* of the heat transfer component 400 located adjacent to the second component 600.

In certain example, the width of the gap or opening in the support component 300 may be greater than or equal to the width of the heat transfer component 400.

In certain example, the second layer of thermally conductive material 650 may be disposed over an area comprising an entire width of the heat transfer component 400.

In certain example, the second layer of thermally conductive material 650 may be disposed over an area comprising an entire width of the gap or opening in the support component 300.

In certain example, the heat dissipation structure 10 may comprise a separator 314 forming a barrier between the first component 501 and the second component 600.

In the present disclosure, the separator 314 may be referred to as the barrier unit 314.

In certain example, the separator 314 may be connected to the support component 300 or may be formed integrally with the support component 300.

In certain example, the second layer of thermally conductive material 650 may be disposed in at least a part of a region between the second component 600 and the separator 314.

In certain example, the second layer of thermally conductive material 650 may comprise a thermally conductive gel.

In certain example, the second layer of thermally conductive material 650 may have a higher thermal conductivity than air.

In certain example of the present disclosure, by providing a second layer of thermally conductive material 650 between the heat transfer component 400 and the second component 600, for example as disclosed above, the efficiency and/or effectiveness of thermal transfer from the heat transfer component 400 to the second component 600 may be improved, for example relative to a structure in which a full or partial air gap exists between the heat transfer component 400 and the second component 600. Accordingly, heat dissipation performance may be improved. Such an air gap may occur, for example, when the second component is attached using an adhesive, such as adhesive tape, wherein an air gap may be formed at a region where the adhesive is absent. Air has a relatively low thermal conductivity and therefore heat may not be transferred efficiently and/or effectively across an air gap.

According to an example, an auxiliary filling member 502 may be disposed between the circuit board 500 disposed in the first area 312 and the bracket 300. An example of the filling member 650 may be applied to the auxiliary filling member 502. For example, the auxiliary filling member 502 may be disposed to cover the heat source 501 and an components mounted on the circuit board 500. Further, the auxiliary filling member 502 may contact a portion of the bracket 300 corresponding to the first area 312 to transfer the heat generated from the heat source 501 to the bracket 300 and the vapor chamber 400.

According to an example, the first portion 400*a* may receive heat from the heat source 501 and transfer it to the battery 600. For example, the first portion 400*a* may contact the bracket 300 corresponding to the first area 312 to receive heat from the heat source 501 disposed in the first area 312 and transfer the heat to the second portion 400*b*. The second portion 400*b* may contact the filling member 650 thermally connected to the battery 600 to transfer the heat received from the first portion 400*a* to the battery 600. According to an example, the battery 600 may radiate the heat received from the vapor chamber 400 to the outside or diffuse the heat thereinside.

According to an example, the filling member 650 may be disposed in the gap 319 between the barrier unit 314 and the battery 600. For example, the filling member 650 may be disposed to surround the whole or part of an edge area (the edge in the −y-axis direction) of the battery 600. Further, one side of the filling member 650 may contact an edge area (the edge in the −y-axis direction) of the battery 600, and the other side thereof may contact the barrier unit 314, enhancing the diffusion efficiency of the heat received from the vapor chamber 400.

According to an example, there may be provided an electronic device comprising a bracket (e.g., the bracket 300 of FIG. 5) including a first area (e.g., the first area 312 of FIG. 7), a second area (e.g., the second area 313 of FIG. 7) partitioned from the first area, and a heat dissipation area (e.g., the receiving area 302 of FIG. 5) formed from a portion of the first area to a portion of the second area; a circuit board (e.g., the circuit board 500 of FIG. 5) including a heat source (e.g., the heat source 501 of FIG. 5) and disposed in the first area; a battery (e.g., the battery 600 of FIG. 5) disposed in the second area; a vapor chamber (e.g., the vapor chamber 400 of FIG. 5) disposed in the heat dissipation area and including a first portion (e.g., the first portion 400*a* of FIG. 5) disposed to face the heat source and a second portion (e.g., the second portion 400*b* of FIG. 5) disposed to face the battery to provide a transfer path of heat generated from the heat source; and a filling member (e.g., the filling member 650 of (b) of FIG. 9) applied between the second area and the battery to transfer the heat from the vapor chamber to the battery, wherein the vapor chamber includes a buffer area (e.g., the buffer area 440 of FIG. 8) formed in an edge area to accommodate the filling member.

According to an example, there may be provided the electronic device, further comprising an adhesive member (e.g., the adhesive member 640 of (a) and (b) of FIG. 9) disposed between the second area and the battery; wherein the adhesive member is disposed to surround at least a portion of the heat dissipation area.

According to an example, there may be provided the electronic device, wherein the adhesive member and the heat dissipation area are disposed to be spaced apart from each other by a predetermined width or more.

According to an example, there may be provided the electronic device, wherein the filling member is disposed to be spaced apart from the adhesive member.

According to an example, there may be provided the electronic device, wherein the filling member has a side in contact with the battery and another side in contact with the vapor chamber.

According to an example, there may be provided the electronic device, wherein at least a portion (e.g., the heat transfer portion 303 of FIG. 5) of the bracket is disposed between the heat source and the first portion.

According to an example, there may be provided the electronic device, wherein the bracket includes a barrier rib (e.g., the barrier rib 314 of FIG. 7) for partitioning the first area and the second area.

According to an example, there may be provided the electronic device, wherein the battery is disposed to be spaced apart from the barrier rib, and wherein the filling member is disposed between the barrier rib and the battery.

According to an example, there may be provided the electronic device, further comprising an auxiliary filling member (e.g., the auxiliary filling member 502 of FIG. 12) disposed between the heat source and the first area.

According to an example, there may be provided the electronic device, wherein the filling member is formed in a liquid or semi-solid state.

According to an example, there may be provided the electronic device, wherein a thermal conductivity of the filling member is larger than a thermal conductivity of the adhesive member.

According to an example, there may be provided the electronic device, wherein the heat dissipation area corresponding to the first area is formed of a concave portion, and the heat dissipation area corresponding to the second area is formed of an opening.

According to an example, there may be provided a method for manufacturing an electronic device comprising preparing a bracket including a first area (e.g., the first area 312 of FIG. 7), a second area (e.g., the second area 313 of FIG. 7) partitioned from the first area, and a heat dissipation area (e.g., the receiving area 302 of FIG. 5) formed from a portion of the first area to a portion of the second area; a circuit board (e.g., the circuit board 500 of FIG. 5) including a heat source (e.g., the heat source 501 of FIG. 5) and disposed in the first area; a battery (e.g., the battery 600 of FIG. 5); and a vapor chamber (e.g., the vapor chamber 400 of FIG. 5) disposed in the heat dissipation area and including a first portion disposed to face the heat source and a second portion disposed adjacent to the first portion to provide a transfer path of heat generated from the heat source (e.g., (a) of FIG. 9); applying a filling member (e.g., the filling member 650 of (b) of FIG. 9) to the second portion (e.g., (b) of FIG. 9); and disposing the battery on the filling member (e.g., (c) of FIG. 9); wherein the vapor chamber includes a buffer area (e.g., the buffer area 440 of FIG. 8) formed in an edge area to accommodate the filling member pressed by the battery.

According to an example, there may be provided the method further comprising disposing an adhesive member (e.g., the adhesive member 640 of (a) and (b) of FIG. 9) to surround the heat dissipation area.

According to an example, there may be provided the method, wherein disposing the adhesive member includes disposing the adhesive member to be spaced apart from the heat dissipation area by a predetermined distance.

According to an example, there may be provided the method, wherein the bracket includes a barrier rib (e.g., the barrier rib 314 of FIG. 7) for partitioning the first area and the second area.

According to an example, there may be provided the method, wherein disposing the battery on the filling member includes disposing the battery to be spaced apart from the barrier rib; and wherein the filling member pressed by the battery is disposed between the barrier rib and the battery.

According to an example, there may be provided the method, wherein the filling member is formed in a liquid or semi-solid state.

According to an example, there may be provided the method, wherein a thermal conductivity of the filling member is larger than a thermal conductivity of the adhesive member.

According to an example, there may be provided the method, wherein at least a portion of the heat dissipation area for the second portion to be disposed is formed of an opening.

It is apparent to one of ordinary skill in the art that an electronic device including a heat dissipation structure as described above are not limited to the above-described example and those shown in the drawings, and an changes, modifications, or alterations may be made thereto without departing from the scope of the present disclosure.

What is claimed is:

1. An electronic device comprising:

a display;

a bracket including a first area, a second area partitioned from the first area, and a receiving area formed from a portion of the first area to a portion of the second area, at least a portion of the receiving area being in form of an opening;

a circuit board including a heat source and disposed in the first area;

a battery disposed in the second area;

a vapor chamber disposed in the receiving area and configured to provide a transfer path of heat generated from the heat source to the battery, wherein the vapor chamber comprises:

a first surface including a first portion disposed to face the heat source and a second portion disposed to face the battery, and a second surface opposite to the first surface, disposed to face the display; and a filling member applied between the second portion of the vapor chamber and the battery.

2. The electronic device of claim 1, further comprising:

an adhesive member disposed between the second area and the battery, wherein the adhesive member is disposed to surround at least a portion of the receiving area.

3. The electronic device of claim 2, wherein the adhesive member and the receiving area are disposed to be spaced apart from each other by a predetermined width.

4. The electronic device of claim 3, wherein the filling member is disposed to be spaced apart from the adhesive member.

5. The electronic device of claim 1, wherein the vapor chamber includes a buffer area formed in an edge area to accommodate the filling member, and wherein the filling member has a side in contact with the battery and another side in contact with the second portion of the vapor chamber.

6. The electronic device of claim 1, wherein at least a portion of the bracket is disposed between the heat source and the first portion.

7. The electronic device of claim 1, wherein the bracket includes a barrier rib for partitioning the first area and the second area.

8. The electronic device of claim 7, wherein the battery is disposed to be spaced apart from the barrier rib, and wherein the filling member is disposed between the barrier rib and the battery.

9. The electronic device of claim 1, further comprising an auxiliary filling member disposed between the heat source and the first area.

10. The electronic device of claim 1, wherein the filling member is formed in a liquid or semi-solid state.

11. The electronic device of claim 2, wherein a thermal conductivity of the filling member is larger than a thermal conductivity of the adhesive member.

12. The electronic device of claim 1, wherein the receiving area corresponding to the first area is formed of a concave portion, and the receiving area corresponding to the second area is formed of the opening.

13. A method for manufacturing an electronic device including a heat dissipation structure, the method comprising:

preparing a bracket including a first area, a second area partitioned from the first area, and a receiving area formed from a portion of the first area to a portion of the second area, wherein a circuit board including a heat source is disposed in the first area, and wherein a vapor chamber is disposed in the receiving area and includes a first portion disposed to face the heat source and a second portion disposed adjacent to the first portion to provide a transfer path of heat generated from the heat source;

applying a filling member to the second portion; and disposing a battery on the filling member, wherein the vapor chamber includes a buffer area formed in an edge area to accommodate the filling member pressed by the battery.

14. The method of claim 13, further comprising:

disposing an adhesive member to surround the receiving area.

15. The method of claim 14, wherein the disposing of the adhesive member includes disposing the adhesive member to be spaced apart from the receiving area by a predetermined distance.

* * * * *